United States Patent

Guyton

[11] 4,228,544
[45] Oct. 14, 1980

[54] ANTENNA SYSTEM USING ANTENNA BASE IMPEDANCE TRANSFORMING MEANS

[76] Inventor: James H. Guyton, R.R. #1, P.O. Box 179, Syracuse, Ind. 46567

[21] Appl. No.: 870,961

[22] Filed: Jan. 19, 1978

[51] Int. Cl.² .................. H04B 1/18; H03H 7/38
[52] U.S. Cl. .................. 455/282; 333/32; 343/852; 343/860; 455/291; 455/292
[58] Field of Search .................. 325/373, 381, 18, 384, 325/385, 377, 378, 386, 375, 315, 317; 343/701, 852, 860, 861; 333/32, 80 T, 213, 216, 217

[56] References Cited

U.S. PATENT DOCUMENTS

| | | | |
|---|---|---|---|
| 2,135,234 | 11/1938 | Fill | 325/385 |
| 2,529,370 | 11/1950 | Bell | 325/381 |
| 3,051,903 | 8/1962 | Morrow | 325/373 |
| 3,582,791 | 6/1971 | Slavin | 325/381 |
| 3,725,942 | 4/1973 | Ukmar | 343/860 |
| 3,965,426 | 6/1976 | Ringland | 343/701 |
| 4,001,696 | 1/1977 | Bannerman | 325/373 |
| 4,095,229 | 6/1978 | Elliot | 343/852 |

FOREIGN PATENT DOCUMENTS

2115657  10/1972  Fed. Rep. of Germany ........... 343/701

OTHER PUBLICATIONS

Terman, "Radio Engineers Handbook", 1st Ed.; (McGraw Hill, 1943), p. 430.
Johnson, "Amplified Car Radio Antennas", Radio—Electronics, May 1972, pp. 37-39, 78-79, 88-91.

*Primary Examiner*—Marc E. Bookbinder
*Attorney, Agent, or Firm*—Reising, Ethington, Barnard, Perry & Brooks

[57] ABSTRACT

An antenna system is disclosed for plural band radio receivers having a common antenna. The system is especially adapted for AM/FM automobile broadcast receivers and may be used with a CB transceiver with a tri-band antenna. An impedance transforming means is provided at the base of the antenna and a single transmission line or lead-in cable extends from the impedance transforming means to the AM/FM receiver. The impedance transforming means has a high input impedance for the AM and FM bands and a relatively low output impedance to minimize the signal loss in transmission from the antenna to the receiver. The impedance transforming means includes a field effect transistor in a common source configuration and means are provided to produce substantially 100% voltage degeneration for both AM and FM signals. The impedance transforming means is also useful for automobile AM broadcast receivers to avoid the need for alignment of the antenna trimmer after installation of the antenna and lead-in cable on the automobile.

12 Claims, 5 Drawing Figures

ANTENNA SYSTEM USING ANTENNA BASE IMPEDANCE TRANSFORMING MEANS

TECHNICAL FIELD

This invention relates to radio receivers and more particularly relates to plural-band receivers having a common antenna. It is especially useful in automobile AM/FM radio receivers and is also useful in other receiver installations.

A major objective in the design of radio receivers is to obtain good operation in the reception of weak signals. This is especially difficult in automobile receivers since the physical size of the antenna is limited by installation problems on the vehicle and other considerations, such as cost and appearance. The problem of weak signal reception is further aggravated by the common practice of using a single antenna for the automobile entertainment radio having both amplitude modulation (AM) and frequency modulation (FM) bands because a design compromise is required in transmitting the antenna signal to the radio. This compromise results in substantial losses in the signal between the antenna and the radio.

The current practice in automobile AM/FM receivers is to use a single antenna which has a length of about one-quarter wavelength at the FM frequencies. Such an antenna has a base impedance which is approximately equal to the input impedance of the receiver, approximately 50 ohms. The FM signal could be transmitted from the antenna to the radio with substantially no losses if a transmission line or lead-in cable having a surge or characteristic impedance of 50 ohms were used. However, such a cable has such a high capacitance that it greatly reduces the AM signal at the radio. The compromise, in current practice, is to use a cable having a characteristic impedance of about 100 ohms and which has a capacitance lower than 50 ohm cable to increase the AM signal at the radio. However, a cable of this impedance, even when it is kept as short as possible, develops standing waves for the FM signals which can greatly attenuate the FM signal delivered to the radio.

In automobile radios, weak signal reception of AM signals is characteristically poor unless a special adjustment is made after radio installation on the car. Such an adjustment adapts the input impedance of the radio to the particular antenna and lead-in cable installation and is made by adjusting an antenna trimmer capacitor on the radio. It is difficult to perform and inspect on an automobile production line and unless it is done properly the performance of the radio is noticeably degraded.

In the past few years citizens band (CB) radio has become popular for use in automobiles. The CB radio commonly takes the form of a transceiver, and operates in the 27 megacycle band. The CB sets typically required separate antennas until the advent of factory installed CB sets. Current practice includes the use of a single antenna for tri-band (AM/FM/CB) reception and CB transmission. This requires a band splitter circuit which, in current practice is connected with the antenna through a long high impedance cable which produces a poor standing wave ratio for the CB transceiver and results in loss of signal delivered to the entertainment radio, especially on AM.

There is a need for an improved antenna system, especially for automobile radios, for plural-band receivers.

BACKGROUND ART

In the prior art, attempts have been made to improve the coupling between a single antenna and the input of a dual-band radio. In general, such prior art may be characterized as arrangements to isolate the antenna from the lead-in cable by an amplifier which provides high signal strength to the radio input regardless of losses in the lead-in line. Theoretically, good performance should be obtained by using a tuned amplifier with means to tune it to the tuned frequency of the radio; however, in practice, such arrangements are complicated and expensive and the expected results are not achieved. A less complicated arrangement uses an untuned amplifier which amplifies all signals in the band; however, it produces a greater increase in the noise output than in the signal output. Furthermore, an untuned amplifier produces mixing or cross modulation of stations in the received bands regardless of the selectivity of the receiver.

The Slavin U.S. Pat. No. 3,582,791 discloses an antenna coupling circuit in which an amplifier is connected to the base of an automobile antenna and a special coupling circuit is provided to eliminate the detuning effect of antenna length changes. The amplifier uses a field effect transistor (FET) having an input coupled to the antenna and an output inductively coupled to the special coupling circuit which includes a voltage dependent capacitor.

The Bannerman U.S. Pat. No. 4,001,696 discloses an antenna for automobile AM/FM receivers using a transistor preamplifier at the antenna. The Morrow U.S. Pat. No. 3,051,903 discloses an automobile radio, presumably an AM receiver, with a preamplifier at the antenna base.

In radio circuits, it is known to obtain impedance matching by use of particular amplifier configurations. For example, the use of a cathode follower power amplifier for coupling a high impedance source to a low impedance cable is described in "Radio Engineers Handbook", Terman, 1st Ed. (McGraw Hill, 1943), page 430.

DISCLOSURE OF THE INVENTION

A principal object of this invention is to provide an antenna system, especially for dual-band radios, which enables the use of a single antenna for plural-band reception that minimizes the signal losses between the antenna and the receiver. In particular, the invention is adapted for AM and FM broadcast. reception especially for automobile radios. This is accomplished by an impedance transforming means between the antenna and the transmission line or lead-in cable to the receiver. Preferably the impedance transforming means is physically located at the base of the antenna. The impedance transforming means, at AM frequencies, has an input impedance which is relatively high compared to the antenna impedance and has an output impedance which is low relative to the antenna impedance and approximately the same magnitude as the impedance of the transmission line. Further, the impedance transforming means, at FM frequencies has an output impedance which is approximately matched to the impedance of the transmission line. The impedance transforming comprises an amplifying device connected in a common drain configuration and means are provided to produce substantially 100% voltage degeneration at the mid-band frequency of the FM band and at the mid-band frequency of the AM band. The amplifying device preferably takes the form of a field effect transistor. The amplifying device is provided with input and output coupling circuits including phase shift elements which phase shift the feedback voltage toward 180° for both AM and FM frequencies.

Another object of this invention is to provide an automobile broadcast receiver with improved reception of weak signals without the need for adjustment of an antenna trimmer capacitor in the receiver after the antenna and lead-in cable are installed on the car. This is accomplished with an impedance transforming means connected between the antenna and the receiver and having an input impedance in the broadcast frequency band which is relatively high compared to the antenna impedance and having an output impedance which is low relative to the antenna impedance.

A further object of this invention is to provide an improved automobile antenna system in which a single antenna is used for an AM/FM broadcast receiver and for a CB transceiver. This is accomplished with a band-splitter and an impedance transforming means at the base of the antenna with the impedance transforming means coupling the antenna to the AM/FM receiver.

A further object is to provide an impedance transforming means with an amplifying device at the base of an antenna without need for a separate power supply conductor. This is accomplished by using one conductor of the RF transmission line as a power supply conductor from the receiver to the impedance transforming means.

BRIEF DESCRIPTION OF DRAWINGS

A complete understanding of this invention may be obtained from the detailed description that follows, taken with the accompanying drawings in which.

BEST MODE FOR CARRYING OUT THE INVENTION

Figure 1:
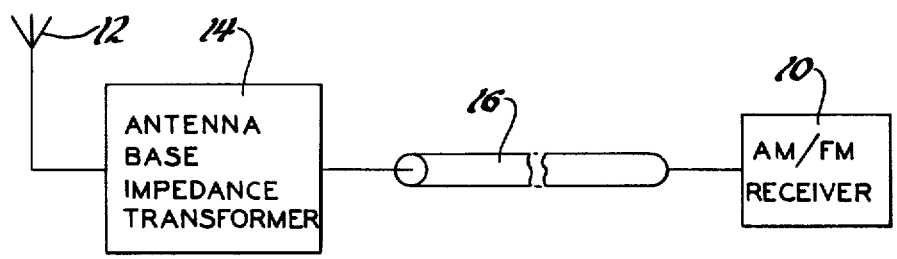
FIG. 1 is a block diagram showing the invention in connection with an automobile radio.

Referring now to the drawings, an illustrative embodiment of the invention will be described for use in automobile radios. It will be understood, however, that the invention is also applicable to other radio receiver installations such as high fidelity entertainment receivers. In the description of the illustrative embodiment of the invention, a particular circuit will be described for AM/FM automobile radios; for a typical circuit design, the values of the components will be given as the description proceeds.

Referring now to FIG. 1, there is shown a block diagram representing an automobile radio embodying this invention. The radio comprises an AM/FM receiver 10 which is provided with an antenna 12 which is used to pick up both AM and FM radio waves and supply a signal to the receiver. According to this invention, an impedance transforming means 14 is connected between the antenna and the receiver. Preferably, the antenna is connected directly to the input of the impedance transforming means, i.e. the impedance transforming means is physically located at the base of the antenna so that there is no transmission line therebetween which would cause a loss of signal. The output of the impedance transforming means is connected through a transmission line 16 of any desired length to the input of the receiver 10. The receiver 10 is of known design, such as the current model AM/FM automobile receivers. As such, it has an input impedance for FM of about 50 ohms at the FM antenna coil and an input impedance for AM of about 40,000 to 100,000 ohms at the AM antenna coil. The antenna 12 is of conventional design for automobile receivers; as such, it takes the form of a base loaded whip antenna which is approximately one-quarter wavelength long for the FM band and is typically 29 to 34 inches long. Such an antenna has a base impedance of about 50 ohms for the FM band and about 50,000 ohms for the AM band. The transmission line 16 is also conventional and preferably takes the form of a coaxial cable of the type identified as RG58/U which has a characteristic impedance of 50 ohms.

The impedance transforming means 14 accepts the signal picked up by the antenna and transforms the impedance of the antenna to a value more suitable for low loss transmission to the receiver. For FM signals, the output impedance of the impedance transforming means 14 is about 50 ohms resistive, thus matching the characteristic impedance of the lead-in cable 16 and the FM imput impedance of the receiver. For AM signals, the output impedance of the impedance transforming means 14 is about 50 ohms with capacitive and resistive components of about the same magnitude. This impedance transformation for AM signals avoids excessive attenuation by the high capacitance value of the cable 16. Also, the impedance transforming means 14 accomplishes the impedance transformation without distorting the signal, even at high signal levels. This avoids crossmodulation, i.e. audio output of two or more stations at the same time regardless of tuning of the receiver. A more complete description of the impedance transforming means 14, together with its input and output impedances, will be given below.

Figure 2:
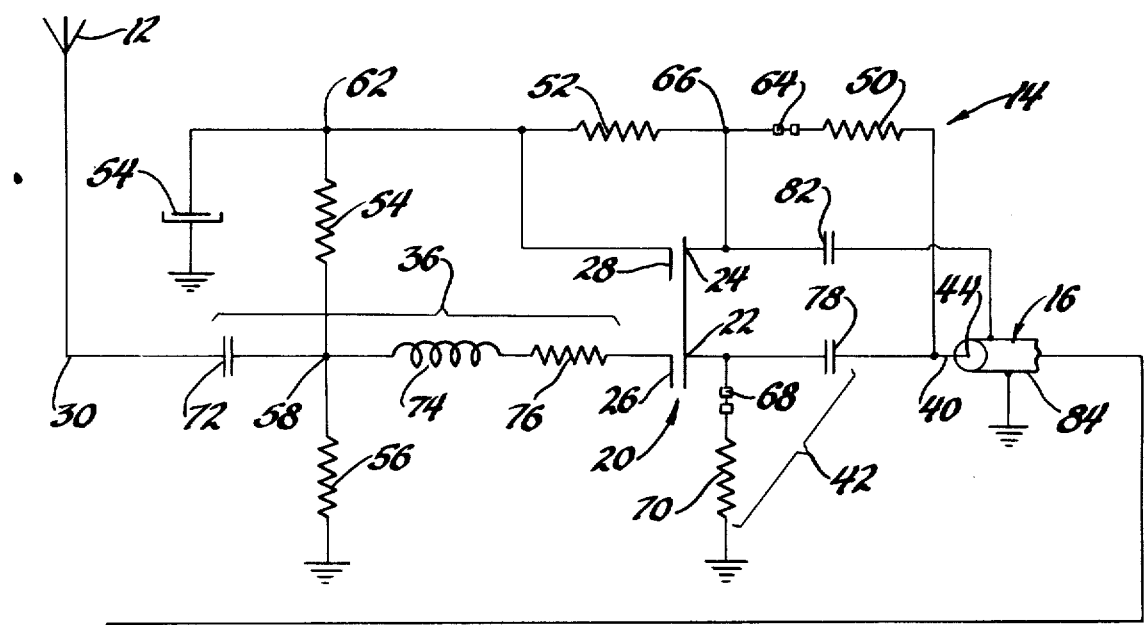
FIG. 2 is a schematic diagram of the invention for use with an AM/FM receiver.
Figure 2:
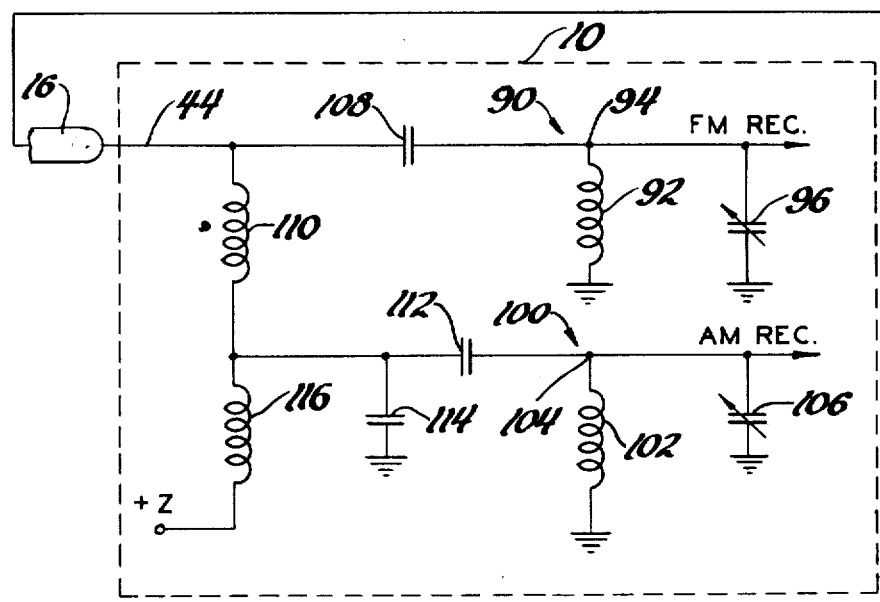

The impedance transforming means 14 is shown in schematic diagram in FIG. 2. The impedance transforming means 14 comprise an amplifying device 20, preferably in the form of a field effect transistor of the type known as a MOSFET transistor. To be specific, the amplifying device 20 is a dual-gate MOSFET of the N-channel depletion type (RCA type 3N140 or Texas Instruments type C2T204). The MOSFET transistor 20 comprises a source 22, a drain 24, a gate-one 26 and a gate-two 28. The MOSFET transistor 20 is connected in a source follower configuration and exhibits a high input impedance and a low output impedance. The input signal to the impedance transforming means 14 is derived from the base terminal 30 of the antenna 12 and applied through an input coupling circuit 36 to gate-one 26 of the MOSFET transistor. The input coupling circuit 36 will be described in detail below. The output of the impedance transforming means 14 is taken from an output terminal 40 which is coupled to the source 22 of the MOSFET transistor through an output coupling circuit 42. The output coupling circuit 42 will be described in detail below. The output terminal 40 is connected to the center conductor 44 of the cable 16. The power supply voltage for the MOSFET transistor 20 is preferably suppplied through the center conductor 44 in a manner which will be described below. The MOSFET transistor 20 is provided with a bias circuit which comprises a resistor string connected between the center conductor 44 and ground. The resistor string includes a resistor 50 (200 ohms), a resistor 52 (680K), a resistor 54 (1 MEG), and a resistor 56 (1.2 MEG). The junction 58 of resistors 54 and 56 is connected to gate-one 26 of the MOSFET transistor through a portion of the input coupling circuit 36. The junction 62 of resistors 52 and 54 is connected to gate-two 28 of the MOSFET transistor. A large bypass capacitor 54 (4 mfd) is connected from junction 62 to ground to remove any residual low frequency modulation on the power supply voltage. A pair of ferrite choke beads 64 are disposed between the resistors 50 and 52 and are effective to increase the impedance of the resistor 50 and to remove it as a load for FM signals. The supply voltage is applied to the drain 24 of the MOSFET transistor by connection thereof to the junction 66 between the resistor 52 and choke beads 64. The source 22 of the MOSFET transistor is connected to ground through a pair of ferrite choke beads 68 and a source resistor 70 (470 ohms). The choke beads 68 effectively remove the resistor 70 as a load for FM signals. The power supply voltage at the junction 40 is about 8 volts and the biasing arrangement just described gives a mutual conductance of about 9000 micromhos.

Before describing the input coupling circuit 36 and the output coupling circuit 42 in detail, it will be helpful to consider the feedback characteristics of the MOSFET transistor 20 in the impedance transforming means. The MOSFET transistor is connected in a common drain configuration so that the output voltage at source 22 is fed back to gate-one 26. It is desired to operate the MOSFET transistor with substantially 100% voltage degeneration in order to provide a low output impedance and impedance matching, as will be described below. The feedback voltage is applied from the output at source 22 back to the input circuit 36 through the impedance of the antenna. (Gate-two 28 is effectively inactive in the circuit.) At the AM frequencies, the impedance of the antenna is significantly capacitive; at the FM frequencies the input impedance of the MOSFET transistor is significantly capacitive and the antenna impedance may be significantly inductive or capacitive, depending upon its physical dimensions. These reactive impedances tend to cause the phase of the feedback voltage to be different from the desired 180° phase angle between it and the voltage induced in the antenna.

In order to obtain the desired degeneration of substantially 100%, means are provided to control the phase shift of the feedback voltage for both FM and AM frequencies. For the FM frequencies, this is provided in the input coupling circuit 36 and for the AM frequencies it is provided in the output coupling circuit, as will be described below.

For FM signals, the input impedance of the MOSFET transistor 20 at gate-one 26 has a capacitive reactance component, and a significant portion of this reactance is caused by capacitance in the MOSFET device 20 between gate-one 26 and source 22. This capacitance results in some feedback directly from source 22 to gate-one 26 which supplements the feedback through the antenna impedance, thus causing undesirable phase shift between the gate-one voltage and the voltage induced in the antenna. Compensation for this phase shift is provided in the input coupling circuit which will now be described.

The input coupling circuit 36 comprises a capacitor 72 (0.0022 mmf.) connected between the antenna base junction 30 and the junction 58. It also comprises a series connection of a choke coil 74 (typically 0.7 uH) and a resistor 76 (200 ohms) connected between the junction 58 and gate-one 26. The resistor 76 is provided to eliminate spurious response in the FM band due to instability tending to occur when the antenna is partly retracted or is otherwise shorter than one-quarter wavelength. The choke coil 74 is for the purpose of providing a phase shift in the FM signal and its value is selected so that the phase between the output voltage and the voltage induced in the antenna at frequencies near the center of the FM band will be approximately 180°. This will produce substantially 100% negative feedback to achieve the proper impedance transformation. Near the center of the FM band, the input impedance of the MOSFET transistor is typically about 500 ohms capacitive reactance. However, an automotive antenna may have a reactance ranging from 100 or 200 ohms capacitive to 100 or 200 ohms inductive, depending upon the physical dimensions of the antenna and the antenna base to ground capacitance. Accordingly, the inductance of the choke coil 74 is selected according to the combined value of reactance of the MOSFET transistor input and the antenna.

For AM signals, the value of antenna capacitance is low enough to cause a phase shift in the feedback signal which would reduce the degeneration significantly from the desired value of 100%. For a 34" whip antenna, the effective capacity (pickup capacity, per se, i.e. not including the mounting base distributed capacitance) is about 5 mmfd. The mounting base distributed capacitance may be as much as 20 mmfd. The MOSFET transistor 29 has an input impedance of about 50,000 to 100,000 ohms resistive across the AM band. Thus, the value of effective antenna reactance taken with the transistor input impedance produces an undesired phase lead in the antenna voltage appearing at the input of the MOSFET transistor. Compensation for this is provided in conjunction with the output coupling circuit, which will now be described.

The output coupling circuit 42 comprises a series capacitor 78 (0.05 uf) connected between source 22 and terminal 40, along with the choke beads 68 and source resistor 70 connected between source 22 and ground. Drain 24 of the transistor is connected through a capacitor 82 (0.05 uf) to the shield 84 of the cable 16. The output of the impedance transforming means 14 is transmitted over the cable 16 to the receiver 10.

In conjunction with the output coupling circuit 42 described above, means are provided to produce a phase shift of the AM output signal to obtain substantially 100% negative feedback and the desired impedance transformation. In the circuit of FIG. 2, the phase shift is provided by a capacitor 114 (0.0018 mfd) at the AM input of the receiver. The capacitor 114 is connected between the center conductor 44 and ground through an FM isolation choke coil 110. The choke coil 110 has an impedance at FM frequencies which is high compared to the impedance of the coaxial cable 16 and does not impose any significant loss of the FM signals. The inductance value of the choke 110 is sufficiently low so that it has negligible inductive reactance at the AM frequencies. The capacitor 114 operates in conjunction with the internal resistance of the source 22 to produce a phase lag in the output voltage of the AM signals. For AM signals, it is effectively connected across the output of the impedance transforming means 14 and hence it functions as part of the coupling circuit 42. The capacitor 114 causes a phase lag such that the feedback voltage for AM signals is substantially 180° out of phase with the voltage induced in the antenna. With this phase compensation, the AM output impedance of the MOSFET transistor is about 110 ohms. This output impedance is in parallel with the source resistor 70 and the filter resistor 50 and the capacitor 114. (The choke beads 64 and 68 are effective only for FM frequency and have no effect on the resistor 50 as an AM load.) This combination of impedances results in an output impedance of around 50 ohms with a leading phase angle of around 30° at the center of the AM band. In the example, the output impedance is 32.5-j30 ohms at 1500 kHz and 52.5-j22 ohms at 600 kHz.

Figure 3:
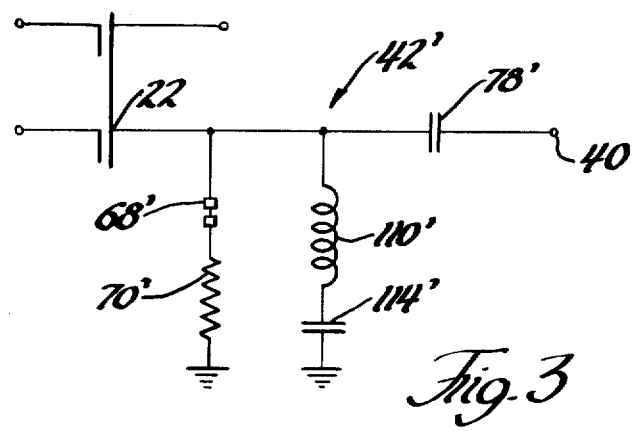
FIG. 3 shows a modification of the circuit of FIG. 2.

In FIG. 3 there is shown a modified output coupling circuit 42'. This coupling circuit 42' comprises a series capacitor 78' connected between source 22 and terminal 40; it also includes choke beads 68' and a source resistor 70' connected between source 22 and ground. This much of the output coupling circuit 42' is of the same configuration as that described in FIG. 2. The coupling circuit 42' also includes a phase shift capacitor 114' which is functionally equivalent to the capacitor 114 described with reference to the circuit of FIG. 2. To prevent shunting of the FM signal to ground, a choke coil 110' is connected in series with the capacitor 114'. The capacitor 114' has a value such that it produces a phase lag of such value in the output voltage for AM signals that a negative feedback of substantially 100% is produced.

The receiver 10, as shown in FIG. 2, is provided, in conventional manner, with an FM input 90 and with an AM input 100. The FM input includes an FM antenna coil 92 connected between the input junction 94 and ground. A trimmer capacitor 96 is connected in parallel with the antenna coil 92. In a similar manner, the AM input comprises an AM antenna coil 102 connected between an input junction 104 and ground and a trimmer capacitor 106 in parallel therewith. The signal transmitted by the cable 16 is connected with the respective inputs of the receiver as follows. For FM, the center conductor 44 is connected through an AM isolation capacitor 108 to the junction 94. The capacitor 108 has a value which effectively blocks the AM signals and passes the FM signals. For AM, the center conductor 44 is connected through an FM isolation choke 110 and a coupling capacitor 112 to the junction 104 of the AM input. The isolation choke 110 has an inductance value which effectively blocks the FM signal and passes the AM signal to the AM input. The coupling capacitor 112 is used to transform the 50 ohm cable impedance for AM signals to the 40,000 to 100,000 ohm impedance of the AM antenna coil. The phase shift capacitor 114, as discussed above, is connected between the center conductor 44 and ground through the FM isolation choke 110.

The power supply voltage for the impedance transforming means, as mentioned above, is supplied from the receiver 10 through the center conductor 44 of the cable 16. This is preferably accomplished, as shown in FIG. 2, as follows. The receiver supply voltage +Z is applied through a choke coil 116 (greater than 100 uH) and the FM isolation choke 110 to the center conductor 44. The coupling capacitor 108 blocks the DC supply voltage from the FM input. The coupling capacitor 112 serves to block the DC supply voltage from the AM input and the choke coil 116 blocks the AM signals from the receiver power supply. The capacitor 114 serves as a filter capacitor for the +Z voltage in addition to its function as a phase shift capacitor, as described above.

In operation, the desired characteristics of the impedance transforming means, as alluded to above, are obtained as follows. For FM signals, the output impedance is of low value and matches the characteristic impedance of the cable 16 which, in turn, is matched to the input impedance of the receiver. For AM signals, the output impedance of the impedance transforming means is of low value, not for impedance matching, but to prevent the high capacity of the cable 16 from attenuating the AM signals. Further, the amplifying device of the impedance transformer is operated in the linear range to prevent cross-modulation in strong signal areas. These operating characteristics are obtained by operating the amplifying device of the impedance transforming means with substantially 100% voltage degeneration, i.e. the output voltage is fed back to the input so that it is 180° out of phase with the input voltage.

At FM frequencies the capacitive reactance of the input of the MOSFET transistor and the reactance in the antenna system is balanced by the input inductance of coil 74; thus, at FM frequencies the feedback voltage is 180° out of phase with the voltage induced in the antenna as described. The MOSFET transistor 20 has a transconductance of 9000 micromhos at FM frequencies. This produces a MOSFET output impedance of 110 ohms. Because of the device feed-through, however, the output impedance measures about 48 ohms, which is very close to the desired 50 ohms at FM frequencies. In the center of the AM band, the output impedance of the impedance transforming means, as discussed above, is around 50 ohms with a leading phase angle of around 30 degrees.

In the illustrative embodiment, the MOSFET transistor current is about 6.5 milliamps. Since it works into a load of about 50 ohms for both AM and FM, the linearity of the MOSFET transistor is good until the input signal drives the drain current to zero. This occurs at an output voltage of 0.65 volts peak-to-peak. The voltage gain of the impedance transforming means is about one-half so the device will handle, without signal distortion, input signals up to about 0.45 volts R.M.S. on FM and about 0.23 volts R.M.S. for an AM signal 100% modulated.

The subject invention affords many advantages in automobile radio. The AM antenna system is completely aligned when the radio is fabricated and no adjustment is necessary at the antenna trimmer capacitor when the receiver is installed in a car. This insures that the AM sensitivity of the receiver will not be degraded because of lack of proper alignment procedure during car installation. Since the impedance transforming means substantially eliminates losses in the lead-in cable, the antenna can be placed anywhere on the car. The whip antennna on the rear deck of a car is generally superior to a front fender mounted whip antenna which has been used in current practice to keep a short cable length. A rear window antenna may also be used with equal or better results than those obtained from a windshield antenna because the antenna wire can be larger and it can be located farther from the window frame without degrading driver visibility. It will be understood that the impedance transforming means of this invention is highly advantageous for use with automobile receivers for AM only, as well as for AM/FM receivers.

Figure 4:
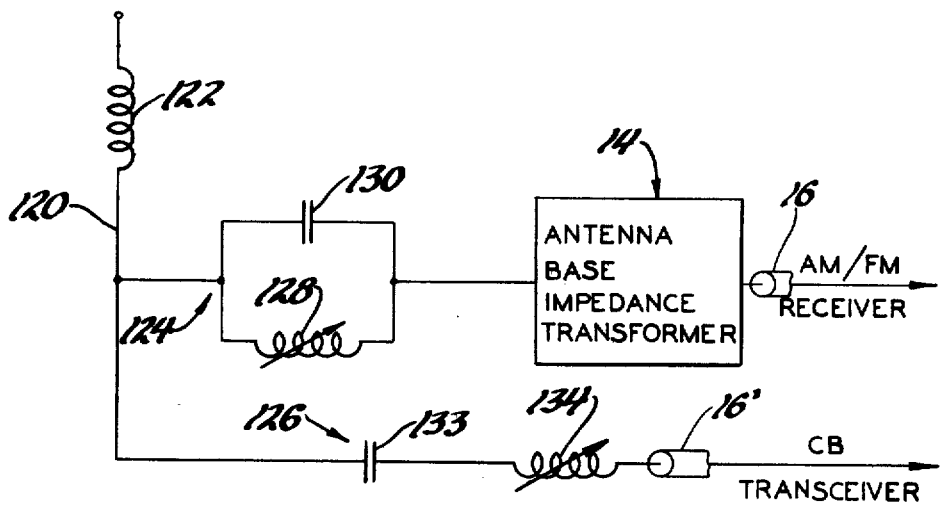
FIG. 4 is a diagram showing the use of the invention with a tri-band antenna for AM/FM and CB operation.

The invention is also especially well adapted for use in conjunction with a tri-band antenna adapted for AM/FM receivers and a CB transceiver. Such an arrangement is shown in FIG. 4. This arrangement includes a whip antenna 120 with a loading coil 122. The antenna is suitably a 34" power operated whip antenna of the type used on 1977 model Cadillac cars. A band splitter to separate the CB band from the AM/FM band is disposed at the base of the antenna 120. Preferably, the base to ground capacitance of the antenna structure is minimized; in the power operated whip antenna, this is accomplished by a whip storage tube and top bearing support constructed of plastic instead of metal. The band splitter comprises a parallel resonant circuit 124 and a series resonant circuit 126 which are both tuned to channel 20 in the 40 channel CB band. The parallel resonant circuit 124 comprises a tunable coil 128 (0.35 uh) and a parallel capacitor 130 (100 uf). The parallel resonant circuit 124 is connected between the antenna base and the impedance transforming means 14 and protects the MOSFET from excessive voltages when transmitting. The series resonant circuit 126 comprises a capacitor 133 (10 uf) and an adjustable series coil 134 (3.5 uh) and is connected between the antenna base and the antenna input of the CB transceiver. The band splitter, comprising circuits 124 and 126, and the impedance transforming means 14 are physically located at the base of the antenna and are preferably disposed within the same circuit package. The impedance transforming means is connected to the AM/FM receiver by a cable 16, suitably type RG58/U. In this arrangement, the impedance transforming means 14 functions in the manner described above and substantially eliminates losses in the cable to the AM/FM radio. Hence, the antenna can be placed anywhere on the car. A cable 16', suitably type RG58/U, is connected between the band splitter circuits 126 and the CB transceiver and provides matching impedance and minimized voltage standing wave ratio.

The impedance transforming means, as discussed above, is preferably included as part of the original factory installed radio and antenna system and the power supply voltage to the impedance transforming means is provided as described above. Similarly, the impedance transforming means and band splitter of FIG. 4 may be provided as factory installed equipment with the AM/FM radio and CB transceiver and antenna. However, either system may be installed as an after-market product and, a special power supply arrangement may be provided.

Figure 5:
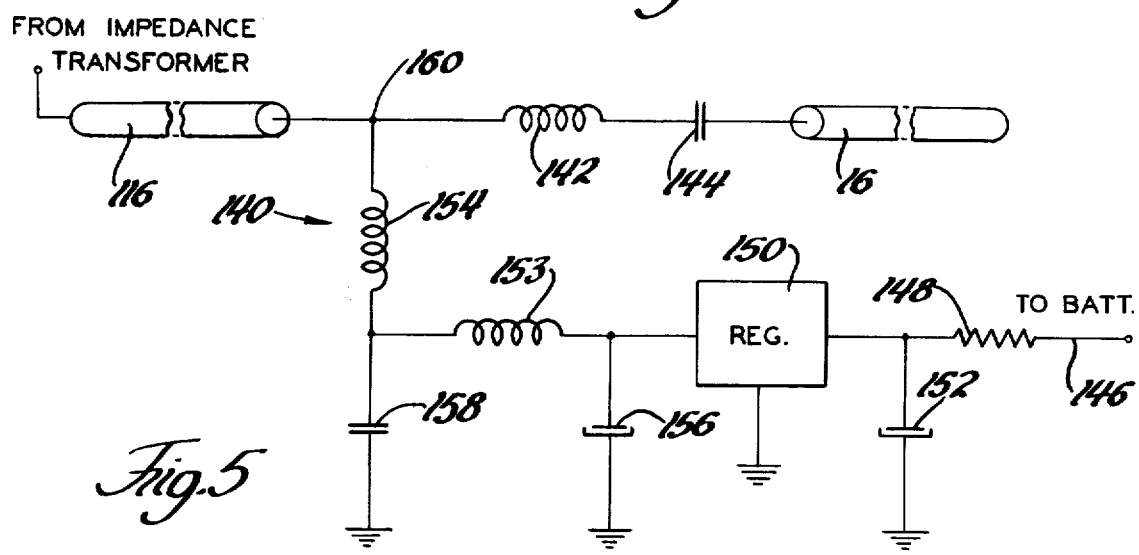
FIG. 5 shows a power supply for the impedance transforming means of this invention.

A power supply adaptor 140 for use in after-market installation of the impedance transformer means is shown in FIG. 5. The adaptor 140 is connected in the lead-in cable 16 between the impedance transformer means and the AM/FM radio. It is physically located near the radio end of the cable. The adaptor 140 comprises a coil 142 (0.06 uH) and a capacitor 144 (30 mmfd.) connected in series with the center conductor of the cable 16. The coil 142 and capacitor 144 are series tuned with a resonant frequency in the FM band, suitably about 100 mHz. This series tuned circuit passes the FM signals without significant attenuation to the receiver. The capacitor 144 couples the low impedance of the lead-in cable for AM signals to the high impedance of the AM antenna coil. Thus, capacitor 144 in FIG. 5 corresponds with capacitor 112 in the circuit of FIG. 2. The capacitor 144 also serves as a DC blocking capacitor to keep the supply voltage from the receiver input circuits. The supply voltage circuit extends from the battery to a junction 160 with the center conductor of the cable 16. In the supply voltage circuit, the battery is connected through a conductor 146, a series resistor 148 (100 ohms) and across a filter capacitor 152 (100 mfd) to the input of a voltage regulator 150. The voltage regulator 150, suitably a Zener diode, has its output connected through a choke coil 153 (100 uH) and a choke coil 54 (2 uH) to the junction 160 with the center conductor of the cable 16. A filter capacitor 156 (4 mfd) is connected from the output of the regulator 150 to ground. A phase shift capacitor 158 (1000 to 2000 mmfd) is connected from the junction of coils 153 and 154 to ground. The capacitor 158 corresponds to the capacitor 114 of FIG. 2 and serves the same phase shifting function. The choke coil 153 has a value which is selected to block the FM signals from the power supply. The choke coil 154 has a value which is selected to block the FM signals from the phase shifting capacitor 158. The power supply adaptor provides a regulated supply voltage of 8 volts to the center conductor of the cable 16 for the impedance transforming means without adversely affecting the RF signal transmission between the impedance transforming means and the AM/FM receiver circuits.

Although the description of this invention has been given with reference to a particular embodiment, it is not to be construed in a limiting sense. Many variations and modifications will now occur to those skilled in the art. For a definition of the invention, reference is made to the appended claims.

What is claimed is:

1. In combination with an AM and FM broadcast receiver having a common antenna, said antenna having a relatively high capacitance reactance as a source at AM broadcast frequencies and having a relatively low impedance as a source at FM broadcast frequencies, said antenna being connected with said receiver for both AM and FM signals, impedance transforming means having an input connected with said antenna and having an output connected with the receiver said impedance transforming means comprising a field effect transistor amplifying device connected in a common drain configuration thereby applying an output voltage thereof as a negative feedback voltage to said input, and a capacitor effectively connected across said output to produce a feedback voltage substantially 180° out of phase with the voltage in the antenna at AM broadcast frequencies whereby substantially 100% degeneration is produced.

2. The invention as defined in claim 1 including an input coupling circuit connected with the input of said transistor and connected with said antenna, said input coupling circuit including a reactance to shift the phase of the feedback voltage at FM frequencies toward 180° compared to the voltage induced in the antenna.

3. The invention as defined in claim 1 including a CB transceiver, a band splitter connected to and physically located at the base of said antenna and having a first splitter output for both AM and FM bands and having a second splitter output for the CB band, a first transmission line connected between the first splitter output and the receiver, and a second transmission line connected between the second splitter output and said CB transceiver.

4. In combination with a receiver adapted for reception of a given frequency band, an antenna having a capacitive reactance at said frequency band, an impedance transforming means having an input connected to the antenna and having an output connected to the receiver, said impedance transforming means comprising an amplifying device having an output voltage and connected in a configuration having a common electrode circuit arranged so the output voltage is applied as a negative feedback voltage to the input of the device, and phase shift means in the output of said impedance transforming means for producing a feedback voltage substantially 180° out of phase with the voltage induced in the antenna at frequencies in said given frequency band to produce approximately 100% degeneration.

5. The invention as defined in claim 4 wherein the phase shift means comprises a capacitive reactance, said capacitive reactance being connected effectively, for frequencies in the AM broadcast band, across the output of the amplifying device.

6. The invention as defined in claim 5 wherein an inductive reactance is connected in series with the capacitive reactance across the output of the amplifying device, said inductive reactance being of such value that it has a high inductive impedance of frequencies in the FM broadcast band and a low inductive impedance to frequencies in the AM broadcast band, whereby any FM signal voltages induced in the antenna will produce an FM signal voltage across the inductive reactance.

7. The invention as defined in claim 4 including a transmission line between the output of the impedance transforming means and the input of said receiver.

8. The invention as defined in claim 4 including a transmission line between the output of the impedance transforming means and the input of the receiver and wherein the receiver includes an AM antenna input circuit including a tuning means adapted to be adjusted independently of the transmission line and the antenna.

9. The invention as defined in claim 1 including a transmission line between the output of the impedance transforming means and the input of said receiver.

10. The invention as defined in claim 1 including a transmission line between the output of the impedance transforming means and the input of the receiver and wherein the receiver includes an AM antenna input circuit including a tuning means adapted to be adjusted independently of the transmission line and the antenna.

11. The invention as defined in claim 7 wherein said impedance transforming means is physically located immediately adjacent to the base of said antenna, a voltage source at said receiver, and a power supply circuit for said amplifying device, said power supply circuit extending from said voltage source through one conductor of said transmission line to said amplifying device, and means in said conductor of the transmission line for blocking the power supply voltage from the receiver and means in the voltage supply circuit for blocking the AM and FM signals from the voltage source.

12. The invention as defined in claim 11 wherein said voltage supply circuit includes a voltage regulator and filter means.

* * * * *